Nov. 29, 1966 H. BERKOWITZ 3,289,106
TRANSISTOR OSCILLATOR USING PARAMETRIC ACTION
Filed Aug. 10, 1965
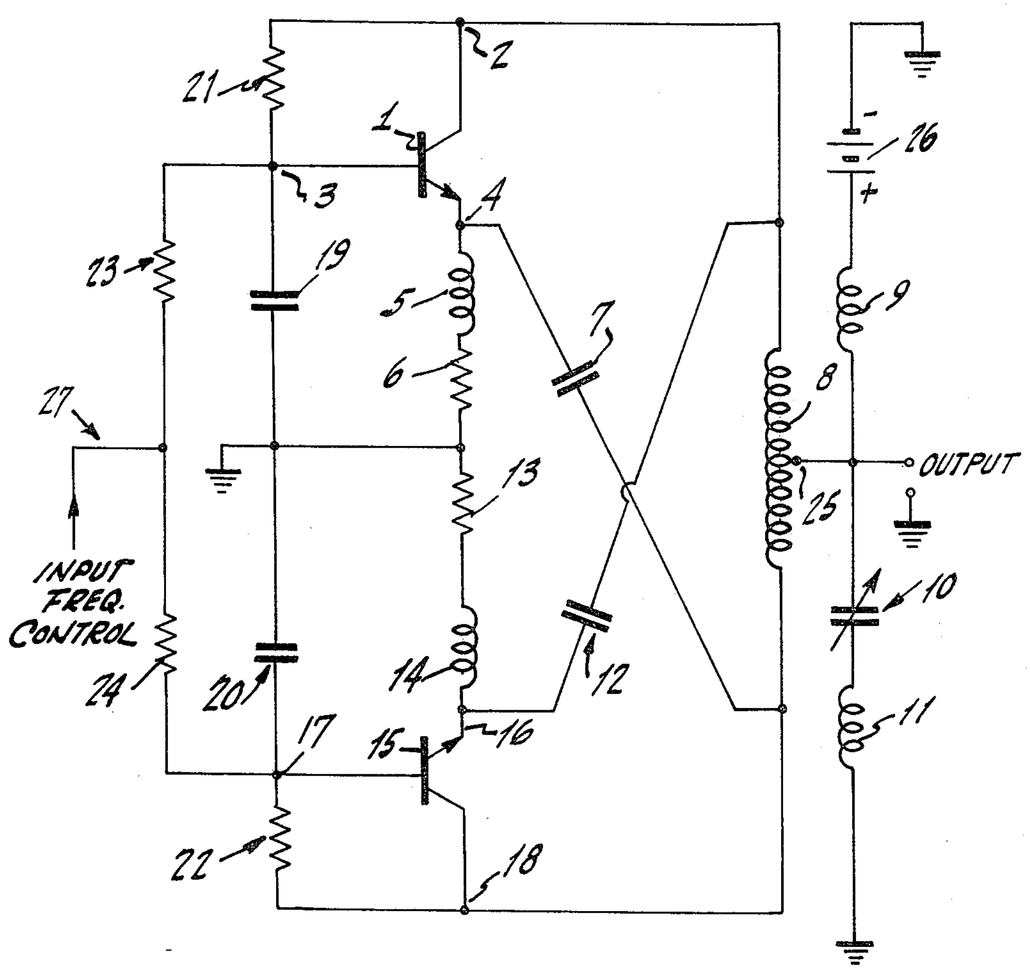
INVENTOR.
HERBERT BERKOWITZ
BY
Edward J. Norton
Attorney United States Patent Office 3,289,106
Patented Nov. 29, 1966

3,289,106

TRANSISTOR OSCILLATOR USING PARAMETRIC ACTION

Herbert Berkowitz, West Orange, N.J., assignor to Radio Corporation of America, a corporation of Delaware Filed Aug. 10, 1965, Ser. No. 478,676
10 Claims. (Cl. 331—117)

This invention relates to transistor oscillators and more particularly to an improved, high frequency transistor oscillator which can be frequency modulated.

The literature on transistor oscillators encompasses many different designs and types. In most cases the freqency of operation of transistor oscillators is limited by the alpha cutoff of the transistor employed. As one tries to operate transistors at frequencies higher than the alpha cutoff frequency, the power obtained is limited and in most cases insufficient for the application. Use is made of tunnel diodes or negative resistance devices to obtain higher oscillating frequencies. One of the disadvantages of negative resistance devices is that the output power is low. To obtain higher power outputs at higher frequencies, frequency multipliers are employed. In most cases multiplication is associated with inefficiency as the power delivered to the load is substantially less than the power consumed by the multiplier, and multiplication requires extra circuitry associated with the primary oscillator and hence greater cost is incurred.

Many applications exist in which it is desirable that high power transistor oscillator be provided as a transmitter stage, for example, to produce the carrier frequency; and hence some means of modulation, which may be frequency modulation, is necessary. Oscillators employing negative resistance devices are difficult to frequency modulate as the circuitry becomes complex.

It is therefore an object of the present invention to provide an improved high frequency oscillator.

Another object is to provide an improved high frequency oscillator whose output frequency is not limited by the alpha cutoff of the transistors employed.

Another object is to provide an improved high frequency oscillator whose output frequency can easily be frequency modulated.

Another object is to provide a simple, efficient, high power, high frequency oscillator.

These and other objects are achieved according to one embodiment of the invention by employing two transistors in a configuration whereby each transistor's collector is coupled to the other transistor's emitter. An inductor with a center tap is connected between the collectors of the two transistors. This inductor forms a resonant circuit with the base-to-collector capacities of the transistors, these capacitors being the predominant frequency determining elements. A second series resonant circuit is connected from the center tap of the inductor to a point of reference potential. This second resonant circuit is tuned so that the oscillator is parametrically operated to increase its frequency of oscillation from that at which the oscillator would otherwise operate by an integer greater than one. If a controlled voltage is applied to both bases, the collector-to-base capacity varies as a function of the applied voltage, affording a change in frequency and therefore modulating the output.

In order that the invention may be more clearly understood, reference is now made to the following description in connection with the accompanying drawing in which the single figure of the drawing shows a transistor oscillator constructed according to one embodiment of the invention.

A transistor 1 has a base electrode 3, a collector electrode 2 and an emitter electrode 4. The emitter 4 is connected to a point of reference potential, such as ground, through the series-connected inductor and resistor 5 and 6. The series inductor 5 is a radio frequency coil, inserted to present a low D.C. impedance in the emitter circuit while maintaining a higher A.C. impedance. Resistor 6 and inductor 5 also serve to limit the D.C. current flowing through transistor 1 and provide a bias potential for transistor 1. The emitter 4 is also connected to the collector 18 of a second transistor 15 through a coupling capacitor 7. The transistor 15 has an emitter electrode 16 which is connected to a point of reference potential such as ground through the series-connected inductor and resistor 14 and 13. The series inductor and resistor 14 and 13 serve the same purposes as previously described for inductor 5 and resistor 6.

The collector 2 of transistor 1 is connected to the collector 18 of transistor 15 through an inductor 8 which has a center tap 25. Both transistor 1 and 15 have a base-to-collector capacitance which is a function of the applied voltage between the base and emitter or the base and collector electrodes. The inductor 8 forms a resonant circuit, at a primary resonant frequency, with the base-to-collector capacitance of transistors 1 and 15. The collectors 2 and 18 of transistor 1 and transistor 15, respectively, are connected to their respective bases 3 and 17 through resistors 21 and 22, which serve as biasing resistors. Capacitor 19 is connected from the base 3 of transistor 1 to a point of reference potential such as ground. The capacitor 19 serves as an A.C. bypass capacitor. The capacitor 20 is connected from the base 17 of transistor 15 to a point of reference potential such as ground and is also an A.C. bypass capacitor. A series combination of resistors 23 and 24 is connected between the base 3 and the base 17 of transistors 1 and 15. The common point of resistors 23 and 24 is brought out and indicated as the input frequency control lead 27.

A D.C. power source 26 such as a battery is connected to the center tap 25 of inductor 8 through a radio frequency coil 9, which prevents A.C. from coupling back to the power source 26. Connected between the center tap 25 and a point of reference potential such as ground is a series resonant circuit comprising variable capacitor 10 and an inductor 11. This series circuit serves to bypass the primary frequency of the oscillator to ground and enchances harmonic generator by parametric induction.

The circuit shown will oscillate at a primary frequency determined by the resonant circuit consisting of inductor 8, the base-to-collector capacities of transistors 1 and 15 and the coupling capacitors 7 and 12. Let as assume that there is an increase of current in transistor 1, this increase of current appears as a voltage drop at the collector 2 of transistor 1 and an increase in voltage at the emitter 4 of transistor 1. This increase is coupled via capacitor 7 to the collector 18 of transistor 15. The increase in voltage at the collector 18 causes the current through transistor 15 to decrease. This decrease in current causes the voltage at the emitter 16 of transistor 15 to decrease. This decrease in emitter voltage is coupled back through capacitor 12 to the collector 2 of transistor 1, which causes transistor 1 to conduct harder. The cycle repeats itself as the circuit is unstable and continues to oscillate. The frequency of oscillation is restrained to a primary frequency determined by the above-mentioned tuned circuit.

When such an oscillator as described is operated at a frequency which approaches the maximum operating frequency of the transistor, there is a time lag within the transistors because of of the finite transit time of carriers across the junctions of the transistors 1 and 15. This lag will cause both transistors 1 and 15 to be on or off at the same time during a portion of the cycle. Hence there is a current imbalance and the output can be taken from the center tap 25 of inductor 8 with respect to a point of reference potential such as ground. The circuit should be operated at a frequency approaching the alpha cutoff frequency so the above described lags will result. The transistors 1 and 15 exhibit variable capacitance characteristics with voltage variations across their electrodes, and the base-to-collector capacities will normally vary at the primary frequency of oscillation as determined by the resonant circuit indicating these capacities and inductor 8. By the present arrangement, these capacitive variations will, in conjunction with the series resonant circuit of capacitor 10 and inductor 11, parametrically operate the oscillator to produce a frequency which is an integer of the primary frequency, and hence, if the primary frequency is chosen to be of the order of magnitude of the alpha cutoff frequency of the transistor, this integer increase in frequency will be beyond the transistor 1 and 15's normal capabilities.

The series resonant circuit comprising inductor 11 and variable capacitor 10 is tuned to the primary resonant frequency and offers a low impedance path to ground at this frequency, thus allowing the increased integer frequency to flow into the output circuit. The inductor 11 and capacitor 10 form in effect an idling circuit at the primary frequency to induce parametric action in the operation of the oscillator.

If a control voltage is applied to the input frequency control lead 27, the primary frequency of the oscillator is varied according to the variation in base-to-collector capacity. The variation in primary frequency also appears in the increased integer frequency by the integer increase. For example, if the oscillator is built to operate at 100 mc. the parametric output may be 200 mc., determined by proper selection of the transistors 1 and 15 and the series resonant circuit comprising inductor 11 and capacitor 10. If by applying a control voltage to lead 27 the oscillator can be made to change its frequency from 100 mc. to 110 mc. the induced parametric frequency will change from 200 mc. to 220 mc. Hence the same voltage swing at the input produces twice the frequency swing of the parametrically induced frequency.

A typical example of component values employed in a high frequency oscillator constructed in the manner of that shown in FIGURE 1 are given below in Table 1.

*Table 1*

| | |
|---|---|
| Transistor 1 | 2N3375. |
| Inductor 5 | 0.22 microhenry. |
| Resistor 6 | 10 ohms. |
| Capacitor 7 | 30 picofarads. |
| Inductor 8 | 3 turns of #18 A.W.G. wire on 1/4" diameter coil forms. |
| Inductor 9 | 0.22 microhenry. |
| Capacitor 10 | .8–10 picofarads. |
| Inductor 11 | 2 turns of #18 A.W.G. wire on 1/2" diameter coil forms. |
| Capacitor 12 | 30 picofarads. |
| Resistor 13 | 10 ohms. |
| Inductor 14 | 0.22 microhenry. |
| Transistor 15 | 2N3375. |
| Capacitor 19 | 49 picofarads. |
| Capacitor 20 | 49 picofarads. |
| Resistor 21 | 2700 ohms. |
| Resistor 22 | 2700 ohms. |
| Resistor 23 | 200 ohms. |
| Resistor 24 | 200 ohms. |
| Battery 26 | +25 volts ±10%. |

The oscillator built with the component values indicated in Table 1 will have a primary resonant frequency of approximately 420 megacycles. The output which is the parametrically induced frequency will be 840 megacycles. By varying the D.C. voltage on the input frequency control lead 27, a 60 megacycle change is obtained for a 10 volt voltage variation. The component values indicated in the example are only typical of one embodiment and can be altered to fit the requirements of a particular application. Other configurations, for example, the use of transistors having opposite conductivity than shown, within the scope of the invention will suggest themselves.

What is claimed is:

1. A transistor oscillator comprising:
(a) a first and a second transistor each having a base, collector and emitter electrode,
(b) means for coupling said first transistor's emitter with said second transistor's collector and said second transistor's emitter with said first transistor's collector,
(c) means to apply suitable operating potentials to said first and second transistor's electrodes,
(d) a first resonant circuit connected between said first and second transistor's electrodes to cause said oscillator to oscillate at a primary resonant frequency, and
(e) a second resonant circuit connected from said first resonant circuit to a point of reference potential and tuned at a frequency which causes said oscillator to be parametrically induced to increase its oscillation frequency from said primary frequency by an integer greater than one.

2. A high frequency transistor oscillator comprising:
(a) a first and second transistor each having base, collector and emitter electrodes,
(b) said first and second transistors having a base-to-collector capacity which is a function of a D.C. voltage applied to said first and second transistor's base,
(c) means for coupling said first transistor's collector with said second transistor's emitter and said first transistor's emitter with said second transistor's collector,
(d) means to apply suitable operating potentials to said first and second transistor's electrodes,
(e) means for applying a signal to said first and to said second transistor's base, whereby said base-to-collector capacity varies according to said signal,
(f) an inductor with a center tap connected between said first and second transistor's collectors so that said inductor forms a resonant circuit with said base-to-collector capacities causing said oscillator to oscillate at a primary resonant frequency, and
(g) a second resonant circuit connected between said center tap and a point of reference potential and tuned at a frequency to cause said oscillator to be parametrically induced to increase its oscillation frequency from said primary frequency by an integer greater than one; said increase in frequency being beyond the normal operating range of said transistors.

3. The combination according to claim 2 and wherein said second resonant circuit is an inductor in series with a capacitor.

4. The combination according to claim 2 and wherein said first and second transistors are of NPN conductivity.

5. The combination according to claim 2 and wherein said first and second transistors are of PNP conductivity.

6. A high frequency transistor oscillator comprising:
(a) a first and second transistor each having a base, collector and emitter electrode,
(b) means for coupling said first transistor's emitter with said second transistor's collector and said first transistor's collector with said second transistor's emitter,
(c) means to apply suitable operating potentials to said first and second transistor's electrodes,
(d) an inductor with a center tap connected between said first and second transistor's collectors, (e) said first and second transistors having a base-to-collector capacity which is a function of a voltage applied to said first and second transistor's base, (f) said inductor and said base-to-collector capacitors forming a resonant circuit so that said oscillator oscillates at a primary frequency, (g) a second resonant circuit connected between said center tap and a point of reference potential and tuned at a frequency to cause said oscillator to increase by parametric action its oscillation frequency by an integer greater than one with said increased frequency being beyond the alpha cutoff frequency of said transistors.

7. A high frequency transistor oscillator comprising:

(a) a first and second transistor each having a base, collector, and emitter electrode, (b) means for coupling said first transistor's emitter with said second transistor's collector and said first transistor's collector with said second transistor's emitter, (c) means to apply suitable operating potentials to said first and second transistor's electrodes, (d) an inductor with a center tap connected between said first and second transistor's collectors, (e) said first and second transistors having a base-to-collector capacity which is a function of a voltage applied to said first and second transistor's base, (f) said inductor and said base-to-collector capacitors forming a resonant circuit by which said oscillator oscillates at a primary frequency, and (g) means for applying a control voltage to said first and second transistor's bases to bring about a change in said primary frequency in accordance with said applied voltage.

8. A high frequency transistor oscillator comprising:

(a) a first and second transistor each having a base, collector and emitter electrode, (b) means for coupling said first transistor's collector with said second transistor's emitter and means for coupling said first transistor's emitter with said second transistor's collector, (c) means to apply suitable operating potentials to said first and second transistor's electrodes, (d) an inductor with a center tap connected between said first and second transistor's collectors, (e) said first and second transistor's having a base-to-collector capacity which is a function of a voltage applied to said first and second transistor's bases, (f) said inductor and said base-to-collector capacities forming a resonant circuit by which said oscillator oscillates at a primary resonant frequency, (g) means for connecting a second resonant circuit between said center tap and a point of reference potential to cause said oscillator to be parametrically induced to increase its oscillation frequency from said primary frequency by an integer greater than one; said increase in frequency being beyond the normal operating range of said transistors as determined by the alpha cutoff frequency of said transistors.

9. A high frequency transistor oscillator comprising:

(a) a first and a second transistor each having a base, collector and emitter electrode, (b) means for coupling said first transistor's emitter with said second transistor's collector and means for coupling said second transistor's emitter with said first transistor's collector, (c) said first and second transistors each having a base-to-collector capacity which is a function of a voltage applied on the base electrode, (d) an inductor with a center tap connected between said first and second transistor's collectors to form a resonant circuit with said base-to-collector capacities and causing said oscillator to oscillate at a primary resonant frequency, (e) a second resonant circuit connected between said center tap and a point of reference potential to cause said oscillator to increase by parametric action its oscillation frequency from said primary frequency by an integer greater than one, and (f) a network adapted to receive an input signal connected between said first and second transistor's bases such that said increased frequency can be varied in accordance with said input signal.

10. A combination as claimed in claim 9 and wherein said network includes two resistors in series between said base electrodes with said input signal being applied to the junction of said resistors.

No references cited.

ROY LAKE, *Primary Examiner.*

J. KOMINSKI, *Assistant Examiner.*